US008368383B2

(12) United States Patent
Fefer et al.

(10) Patent No.: US 8,368,383 B2
(45) Date of Patent: Feb. 5, 2013

(54) METHOD FOR TESTING A VARIABLE DIGITAL DELAY LINE AND A DEVICE HAVING VARIABLE DIGITAL DELAY LINE TESTING CAPABILITIES

(75) Inventors: Yefim-Haim Fefer, Petah Tikva (IL); Mikhail Bourgart, Modiin (IL); Segey Sofer, Reshon Letzion (IL); Yoav Weizman, Kfar-Vitkin (IL)

(73) Assignee: Freescale Semiconductor, Inc., Austin, TX (US)

( * ) Notice: Subject to any disclaimer, the term of this patent is extended or adjusted under 35 U.S.C. 154(b) by 482 days.

(21) Appl. No.: 12/522,034

(22) PCT Filed: Jan. 5, 2007

(86) PCT No.: PCT/IB2007/050035
§ 371 (c)(1),
(2), (4) Date: Jul. 2, 2009

(87) PCT Pub. No.: WO2008/081347
PCT Pub. Date: Jul. 10, 2008

(65) Prior Publication Data
US 2010/0072979 A1 Mar. 25, 2010

(51) Int. Cl.
*H03L 7/06* (2006.01)
*H03K 3/00* (2006.01)
*G01R 31/28* (2006.01)

(52) U.S. Cl. ............... 324/76.77; 327/149; 327/182; 714/724

(58) Field of Classification Search ............... 324/76.77, 324/713; 714/724; 327/149, 158, 161, 182, 327/183, 250, 252, 269, 270, 393, 400
See application file for complete search history.

(56) References Cited

U.S. PATENT DOCUMENTS

| | | | |
|---|---|---|---|
| 4,604,588 A | 8/1986 | Webler et al. | |
| 5,451,894 A * | 9/1995 | Guo | 327/241 |
| 6,437,553 B1 | 8/2002 | Maloney et al. | |
| 6,448,756 B1 | 9/2002 | Loughmiller | |
| 6,587,811 B2 * | 7/2003 | Schleifer et al. | 702/176 |
| 6,850,051 B2 | 2/2005 | Roberts et al. | |
| 2006/0273840 A1 * | 12/2006 | Okajima | 327/261 |

FOREIGN PATENT DOCUMENTS
WO 03012467 A 2/2003

OTHER PUBLICATIONS
International Search Report for PCT Application No. PCT/IB2007/050035.

* cited by examiner

*Primary Examiner* — Timothy J Dole
*Assistant Examiner* — Farhana Hoque

(57) ABSTRACT

A device and a method for testing a variable digital delay line that includes multiple taps. The method includes providing, an input signal to the variable digital delay line and finding, for each tap out of a group of tested taps of the variable digital delay line, a variable delay unit configuration that provides a delay that is closest to a delay introduced by the tap; wherein the variable digital delay line and the variable delay unit belong to the same integrated circuit.

20 Claims, 4 Drawing Sheets

METHOD FOR TESTING A VARIABLE DIGITAL DELAY LINE AND A DEVICE HAVING VARIABLE DIGITAL DELAY LINE TESTING CAPABILITIES

FIELD OF THE INVENTION

The present invention relates to methods for testing a variable digital delay line and devices having variable digital delay line testing capabilities.

BACKGROUND OF THE INVENTION

Many modern integrated circuits include a large number of variable digital delay lines. A variable digital delay line usually includes a sequence of delay units (also referred to as taps) as well as a control circuit that determines which delay units should participate in delaying a signal. The delay of each tap can depend upon various parameters such as manufacturing process variation, temperature and the like.

The tap delay continuously decreases and its accuracy becomes more significant, as modern integrated circuits operate at higher operational frequencies. This delay decrement makes external (out of IC) tap testing that is based upon evaluation of signals delayed by a tap, more susceptible to communication timing errors, phase noises and the like.

There is a growing need to provide robust and reliable methods and devices for testing variable digital delay lines.

SUMMARY OF THE PRESENT INVENTION

A method for testing a variable digital delay line and a device having variable digital delay line testing capabilities, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

The device and method are based upon a built in testing capabilities. An integrated circuit includes the variable digital delay line and a testing circuit that compares the delay of a tap to a delay, introduced by a configurable variable delay unit. The test includes finding the best matching delay of the variable delay unit and configuration, which corresponds to this best matching is provided as the result of the test of a tap. This result is a digital signal and thus can be transmitted over regular noisy transmission lines.

Figure 1:
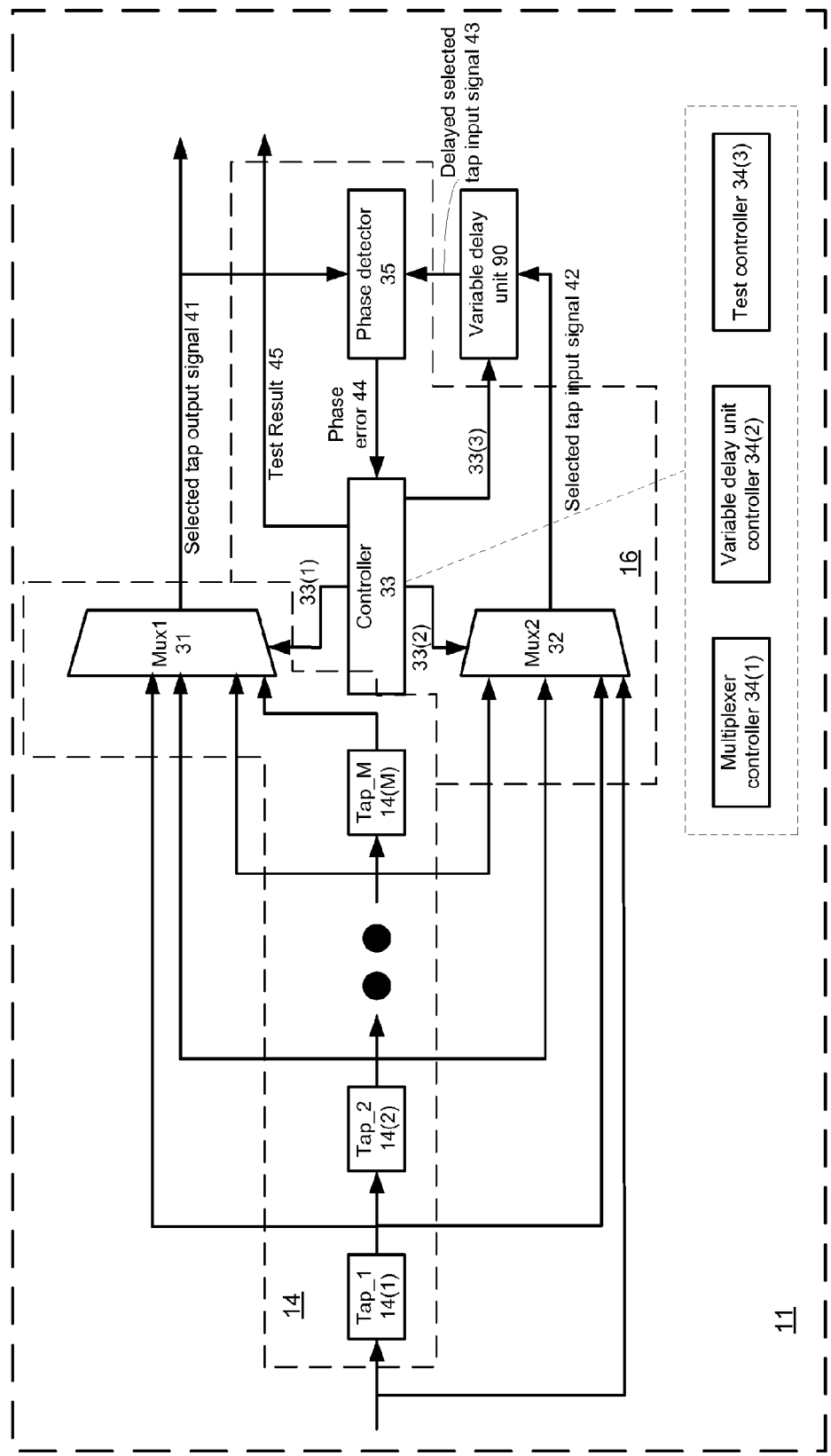
FIG. 1 illustrates a device, according to an embodiment of the invention.

FIG. 1 illustrates device 10 according to an embodiment of the invention.

Device 10 can include one or more integrated circuits, multiple integrated circuits. Device 10 can be a mobile phone, a personal data accessory, a media player, a computer, a controller and the like. Those of skill in the art will appreciate that device 10 can include many circuits that are not illustrated in FIG. 1. Alternatively, Device 10 can include fewer components than those that are illustrated in either one of the following drawings or include other components.

For simplicity of explanation it is assumed that device 10 includes a single integrated circuit 11. Integrated circuit 11 can include multiple variable digital delay lines. For simplicity of explanation only a single variable digital delay line 16 is illustrated.

Integrated circuit 11 includes variable digital delay line 14, variable delay unit 90, control circuit 16 and usually many other components that are not shown.

Variable digital delay line 14 includes multiple (M) taps 14(1)-14(M), first multiplexer 31 and a controller 33. Controller 33 is also a part of control circuit 16. M is a tap number. It is defined during the design of integrated circuit 11 and reflects the ration between the maximal delay, required from variable digital delay line 14 to the expected delay period of a single tap.

Conveniently, controller 33 includes: (i) multiplexer controller 34(1) that sends control signals 33(1) and 33(2) to first and second multiplexers 31 and 32; (ii) variable delay unit controller 34(2) that sends variable delay unit control signal 33(3) to variable delay unit 90; and (iii) test controller 34(3) that controls the test.

Taps 14(1)-14(M) are connected in a sequential manner. The output of each tap is connected to an input of the consecutive tap and to an input of first multiplexer (Mux1) 31. The input of taps 14(1)-14(M) are also connected to a second multiplexer (Mux2) 32 that belongs to control circuit 16. The first and second multiplexers 31 and 32 are controlled by control signals 33(1) and 33(2) that are provided by controller 33. Controller 33 can select a certain tap (for example tap 14(m)) out of taps 14(1)-14(M), send a first control signal 33(1) to first multiplexer 31 that causes first multiplexer 31 to output the output signal of selected tap 14(m) (this signal is referred to as selected tap output signal 41) and send a second control signal 33(2) to second multiplexer 32 that causes second multiplexer 32 to output the input signal of selected tap 14(m) (this signal is referred to as selected tap input signal 42).

Selected tap input signal 42 is sent to variable delay unit 90 and is delayed by variable delay unit 90 to provide delayed selected tap input signal 43.

Conveniently, the timing difference between delayed selected tap input signal 43 and selected tap output signal 41 is measured by phase detector 35 of control circuit 16. Phase detector 35 provides a phase error signal 44 to controller 33.

The selected tap output signal 41 is compared, during multiple test iterations, to delayed selected tap input signal 43 that is generated by delaying selected tap input signal 42 by different delay values, achieved by different configurations of variable delay unit 90. The different configurations of the variable delay unit 90 virtually scan a range of the delay. The range is usually defined such as to cover expected delay of a single tap.

At the end of these multiple comparisons the control circuit 16 selects the variable delay unit configuration (out of a group of tested variable delay circuit configurations) that provided a delay period that is closest to a delay introduced by the tap.

It is noted that the exact delay of the variable delay unit can vary as result of the ambient temperature, manufacturing process variations and the like. Thus, the exact delay, introduced by the variable delay unit 90 is not necessarily known. Nevertheless, when testing a variable digital delay line there is a need to known whether all taps provide substantially the same delay period. Accordingly, instead of comparing delay periods, device 10 compares the configurations of variable delay unit 90 that provided the best matching delays for the different taps of variable digital delay line 16.

Control circuit 16 is adapted to generate (and even store) variable delay configuration information representative of the variable delay unit configuration that provided a delay that is closest to a delay introduced by the tap. This information can be transmitted to another unit of the same integrated circuit, to another integrated circuit and even to another device that can process this information and optionally inform an integrated circuit manufacturer about variable digital delay line failures.

Conveniently, variable delay unit 90 includes an input for receiving a variable digital delay unit control signal and an analog circuit that is adapted to set a value of a supply current (referred further as the analog current). This current is provided to a part of the variable delay unit and controls its delay characteristics in response to the variable digital delay control signal.

Figure 2:
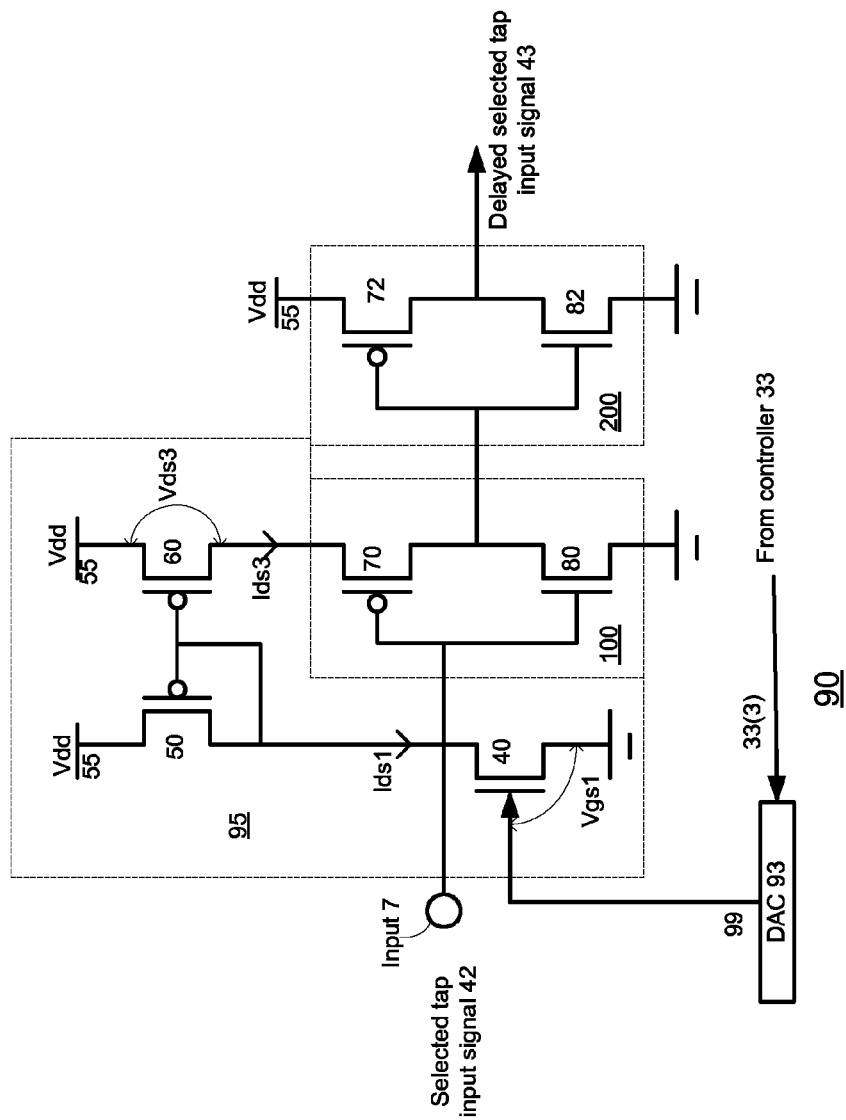
FIG. 2 illustrates a variable delay unit, according to an embodiment of the invention.

FIG. 2 illustrates variable delay unit 90 according to an embodiment of the invention.

Variable delay unit 90 includes digital to analog converter (DAC) 93, first inverter 100, second inverter 200 and current mirror 95. First and second inverters 100 and 200 are connected in a serial manner to each other. They delay the selected tap input signal 42 (by a variable delay unit delay value) to provide delayed selected tap input signal 43.

The variable delay unit delay value is responsive to the variable delay unit control signal 33(3) sent from controller 33. Variable delay unit control signal 33(3) is a digital signal that is converted by DAC 93 to analog control signal 99 that is provided to current mirror 95 that in turn provides a supply current (such as Ids3) that flows through first inverter 100 and affects the delay introduced by first inverter 100.

Current mirror 95 includes transistors 50 and 60. DAC 93 sends analog control signal 99 to the gate of first (n type) transistor 40. The source of first transistor 40 is grounded and its drain is connected to the gate and the drain of second (p type) transistor 50. The gates of second transistor 50 and the gate of third (p type) transistor 60 are connected to each other. The sources of second and third transistors 50 and 60 are connected to voltage supply 55.

The drain of third transistor 60 is connected to supply of first inverter 100 (to the source of first inverter (p type) transistor 70). The source of second inverter (n type) transistor 80 is connected to the drain of first inverter transistor 70 to provide an output node of first inverter 100. The gates of first and second inverter transistors are connected to each other to provide an input node of first inverter 100. The input node receives selected tap input signal 42. The output node of first inverter 100 outputs a delayed and inverted signal. Analog control signal 99 determines the gate source voltage (Vgs1) of first transistor 40. The level of Vgs1 determines the source drain current (Ids1) that flows between the source and the drain of first transistor 40. Ids1 is mirrored by second and third transistors 50 and 60 to a source drain current Ids3 that flows through the source and drain of third transistor 30. Ids3 affects the source drain voltage (Vds3) of third transistor 60. The supply voltage of first inverter 100 equals to Vcc-Vds3.

Accordingly, the propagation delay of first inverter 100 depends on Vcc-Vds3. Second inverter 200 performs another inversion and also delays the delayed and inverted signal from first inverter 100 to provide delayed selected tap input signal 43. Second inverter 200 includes p-type transistor 72 and n-type transistor 82.

Figure 3:
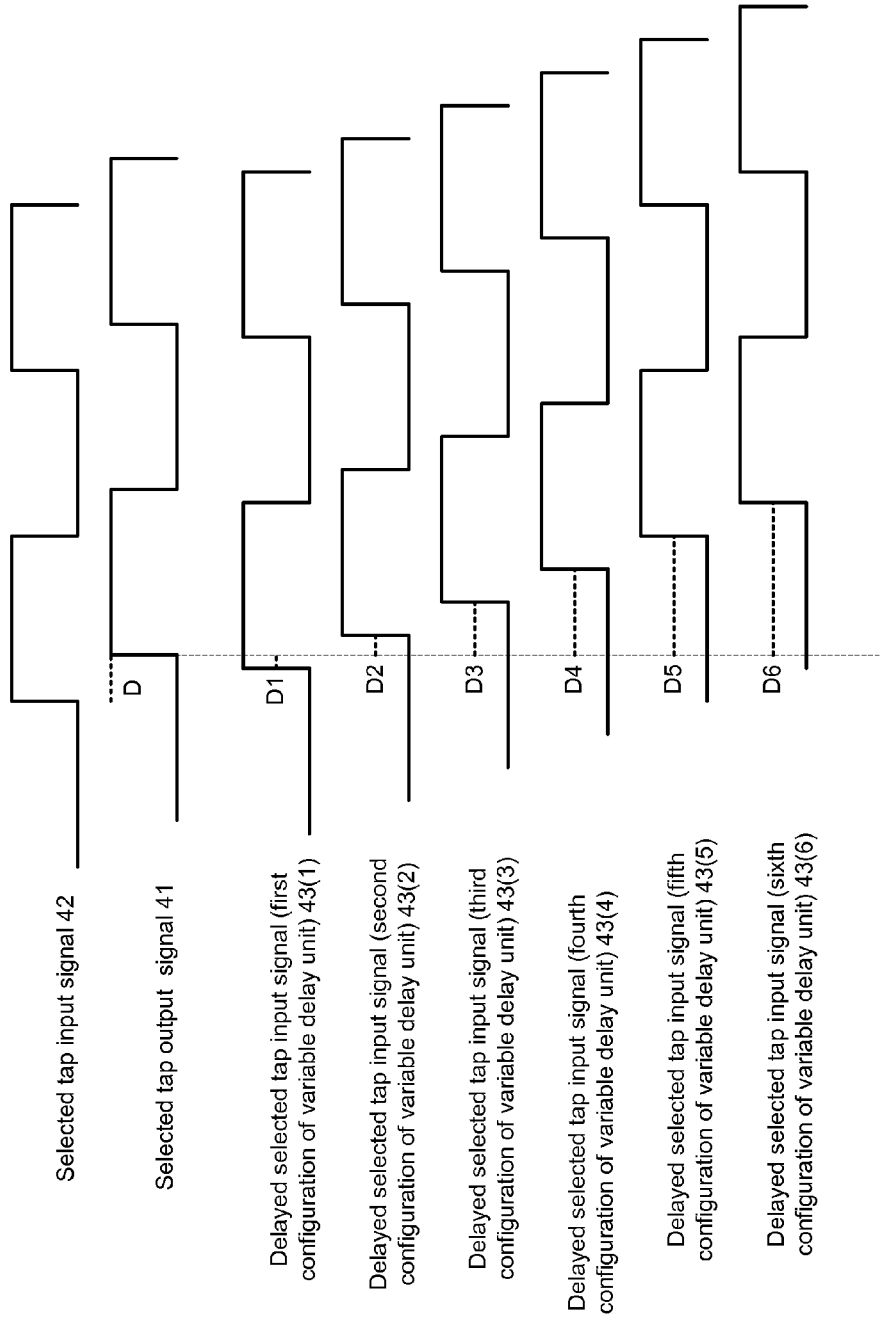
FIG. 3 is a timing diagram, according to an embodiment of the invention.

FIG. 3 is a timing diagram 222, according to an embodiment of the invention. Timing diagram illustrates a selected tap input signal 42, selected tap output signal 41 and six variations of delayed selected tap input signal 43(1)-43(6) provided by six different configurations of variable delay unit 90. The timing differences between delayed selected tap input signals 43(1) and selected tap output signal 41 is denoted as D1-D6. Phase detector 35 provided, during these six tests, phase error signal 44 that reflect D1-D6. Because D1 is the smallest timing difference then the first configuration of variable delay unit 90 is selected as the best configuration of variable delay unit 90 in relation to that selected tap.

Figure 4:
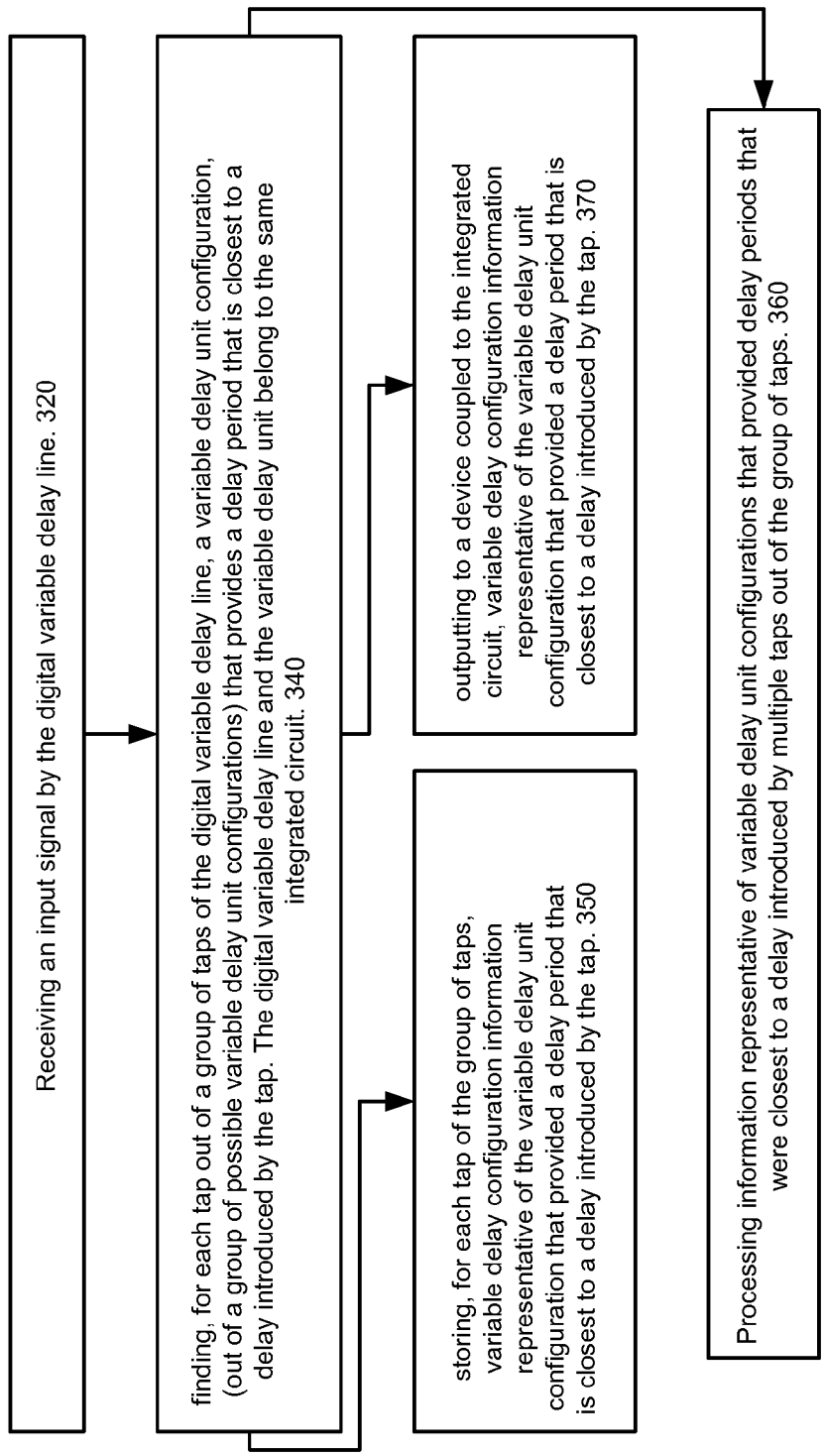
FIG. 4 is a flow chart of a method, according to an embodiment of the invention.

FIG. 4 is a flow chart of a method 300 for testing a variable digital delay line that includes multiple taps, according to an embodiment of the invention.

Method 300 starts by stage 320 of receiving an input signal by the variable digital delay line. Conveniently, the input signal is a periodic signal, but this is not necessarily so. Multiple timing (phase) measurements can be performed only when repetitive signal are received by the variable digital delay line. It is noted that if a non-periodic signal is provided the timing of input signal changes should be synchronized with the timing measurements performed during multiple tests of the multiple taps.

Stage 320 is followed by stage 340 of finding, for each tap out of a group of taps of the variable digital delay line, a variable delay unit configuration, out of a group of possible variable delay unit configurations, that provides a delay period that is closest to a delay introduced by the tap. The variable digital delay line and the variable delay unit belong to the same integrated circuit.

It is noted that the group of tested taps may include all the taps of the variable digital delay line, but this is not necessarily so and only few taps can be tested.

Stage 340 usually includes multiple iterations. These multiple iterations involve selecting different taps as well as different configurations of the variable delay unit. Typically, the delay of a selected tap is compared to each of delays within a variety of delays, provided by the variable delay unit. The variety of delays covers a range of delays that can be defined in view of the expected delays, introduced by a functional tap.

It is noted that range of delay can be scanned per each tap and that this scan can be stopped once the difference between the delay, introduced by a selected tap, to the delay, introduced by the variable delay unit, is small enough.

Stage 340 may include selecting a tap and then altering the configuration of the variable delay unit but this is not necessarily so. For example, stage 340 may include setting the configuration of the variable delay unit and performing multiple comparisons while changing the selected tap.

Referring to the example set forth in FIG. 3, a single selected tap output signal is compared, during six testing iterations, to the delayed signal provided by variable delay unit 90 that is configured in six different configurations.

Conveniently, stage 340 includes at least one of the following: (i) comparing a signal delayed by the tap to a signal delayed by the variable delay unit; (ii) checking multiple variable delay unit configurations and finding for each variable delay unit configuration and for each tap of the group of taps, a timing difference between a signal delayed by the tap to a signal delayed by the variable delay unit; (iii) providing to a phase detector, via a first multiplexer, a tap output signal and providing, by a second multiplexer, a tap input signal to the variable delay unit; and (iv) sending a variable digital delay unit control signal to the variable delay unit and setting a value of an analog current that flows within the variable delay unit in response to the variable digital delay control signal, wherein a delay of the variable delay unit is responsive to the value of the analog current.

Stage 340 is conveniently followed by stage 350 of storing, for each tap of the group of taps, variable delay configuration information representative of the variable delay unit configuration that provided a delay that is closest to a delay introduced by the tap.

Referring to the example set forth in FIG. 3, the variable delay configuration information will indicate that the first configuration of variable delay unit 90 provides the best match. This information can be stored in one or more memory units.

Stage 350 is followed by stage 370 of outputting to a device coupled to the testing device of the integrated circuit, variable delay configuration information representative of the variable delay unit configuration that provided a delay period that is closest to a delay introduced by the tap. This information is of standard digital type and can be sent over regular lines without corrupting the information.

According to an embodiment of the invention stage 340 is also followed by stage 360 of processing variable delay unit configuration information representative of variable delay unit configurations that provided delay periods that were closest to a delay introduced by multiple taps out of the group of taps. Stage 360 can include comparing variable delay unit configurations that provided delay periods that were closest to a delay introduced by multiple taps out of the group of taps. If, for example, the first configuration of variable delay unit 90 provided the best match for each tap (i.e. the first configuration provides a delay that is close to the delay, characteristic of a functional tap) then the variable digital delay line can be deemed functional.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for testing a variable digital delay line that comprises multiple taps, the method comprises:
   receiving, by a tap of the digital variable delay line and by a variable delay unit, an input signal;
   finding, a first configuration for the variable delay unit that provides a delay from the variable delay unit that is closest in time and phase to a delay introduced by the tap;
   wherein the variable digital delay line and the variable delay unit belong to the same integrated circuit.

2. The method according to claim 1, wherein the finding comprises comparing a signal from an output of the tap to a signal from an output of the variable delay unit.

3. The method according to claim 2, wherein the finding further comprises setting multiple second configurations for the variable delay unit and finding for each second configuration a timing difference between a signal from an output of the tap to a signal from an output of the variable delay unit.

4. The method according to claim 2, wherein the finding further comprises comparing by a phase detector, between a signal from an output of the tap provided via a first multiplexer to the phase detector and the input signal that is-provided via a second multiplexer to the variable delay unit, wherein output of the variable delay unit is provided to the phase detector.

5. The method according to claim 1, wherein the finding comprises setting multiple second configurations for the variable delay unit and finding, for each of the second configurations, a timing difference between a signal from an output of the tap to a signal from an output of the variable delay unit.

6. The method according to claim 1, wherein the finding comprises comparing by a phase detector, between a signal from an output of the tap that is provided via a first multiplexer to the phase detector and the input signal that is provided via a second multiplexer to the variable delay unit, wherein output of the variable delay unit is provided to the phase detector.

7. The method according to claim 1, wherein the finding is followed by storing for the tap variable delay unit configuration information representative of the first configuration.

8. The method according to claim 1, wherein the finding is followed by outputting to a device coupled to the test circuit, variable delay unit configuration information representative of the first configuration.

9. The method according to claim 1, wherein the finding is followed by processing variable delay unit configuration information representative of the first configuration.

10. The method according to claim 1, wherein the finding comprises sending a variable delay unit control signal to the variable delay unit, wherein the variable delay unit control signal controls a variable delay unit transfer characteristic in response to the variable delay control signal.

11. A device having variable digital delay line testing capabilities, the device comprises:
    an integrated circuit that comprises:
        a variable digital delay line including a-tap that receives an input signal; and
        a variable delay unit coupled to a control circuit that receives the input signal;
    wherein the control circuit is adapted to find first configuration for the variable delay unit, that provides a delay from the variable delay unit that is closest in time and phase to a delay introduced by the tap.

12. The device according to claim 11, wherein the control circuit is further adapted to compare a phase of the input signal that has been delayed by the tap to a phase of the input signal that has been delayed by the variable delay unit.

13. The device according to claim 12, wherein the control circuit is further adapted to set multiple second configurations for the variable delay unit and find for each second configuration a timing difference between a signal from an output of the tap to a signal from an output of-the variable delay unit.

14. The device according to claim 12, wherein the variable delay unit comprises an input for receiving a variable delay unit control signal and an analog circuit adapted to set a value of an analog current that is provided to a part of the variable delay unit and controls its transfer characteristics.

15. The device according to claim 11, wherein the control circuit is further adapted to set multiple second configurations for the variable delay unit and find, for each of the second configurations a timing difference between a signal from an output of the tap to a signal from an output of the variable delay unit.

16. The device according to claim 11, wherein the control circuit comprises a phase detector, adapted to compare the phase of a signal from an output of the tap provided from a first multiplexer to the phase detector, and the phase of a signal from an output of the variable delay unit.

17. The device according to claim 11, wherein the control circuit is adapted to generate-configuration information representative of the first configuration.

18. The device according to claim 11, wherein the control circuit is adapted to output to another circuit that is coupled to the test circuit configuration information representative of the first configuration.

19. The device according to claim 11, further adapted to process variable delay unit configuration information representative of the first.

20. The device according to claim 11, wherein the variable delay unit comprises an input for receiving a variable delay unit control signal and an analog circuit adapted to set a value of an analog current that is provided to a part of the variable delay unit and controls its transfer characteristics.

* * * * *